United States Patent [19]
Sasaki et al.

[11] Patent Number: 5,619,159
[45] Date of Patent: Apr. 8, 1997

[54] SIGNAL PROCESSING DEVICE AND A METHOD FOR TRANSMITTING SIGNAL

[75] Inventors: Nobuo Sasaki; Toru Ishigaki, both of Kawasaki, Japan

[73] Assignee: Fujitsu Limited, Kawasaki, Japan

[21] Appl. No.: 513,031

[22] Filed: Aug. 9, 1995

Related U.S. Application Data

[63] Continuation of Ser. No. 352,458, Dec. 9, 1994, abandoned, which is a continuation of Ser. No. 198,393, Feb. 18, 1994, abandoned, which is a continuation of Ser. No. 818,890, Jan. 10, 1992, abandoned.

[30] Foreign Application Priority Data

Jan. 10, 1991 [JP] Japan ..................... 3-012377

[51] Int. Cl.$^6$ ........................................ H03K 17/92
[52] U.S. Cl. ............................. 327/527; 327/366
[58] Field of Search ............................... 307/306, 277; 357/5; 333/995; 327/366, 372, 373, 527; 326/1

[56] References Cited

U.S. PATENT DOCUMENTS

| | | | |
|---|---|---|---|
| 3,191,055 | 6/1965 | Swihart | 333/995 |
| 4,837,536 | 6/1989 | Honjo | 307/306 |
| 4,837,609 | 6/1989 | Gurvitch et al. | 357/5 |
| 5,057,877 | 10/1991 | Briley et al. | 357/5 |

FOREIGN PATENT DOCUMENTS

| | | | |
|---|---|---|---|
| 648939 | 9/1962 | Canada | 307/306 |

OTHER PUBLICATIONS

O.K. Kwon et al, "Superconductors as Very High–Speed System–Level Interconnects" IEEE Electron Device Letters vol. EDL–8 No. 12 Dec. 1987 pp. 582–585.

*Patent Abstracts of Japan*, vol. 12, No. 72 (E–588) Mar. 5, 1988 & JP–A–62 214714 (Fujitsu Limited) Sep. 21, 1987.

*Patent Abstracts of Japan*, vol. 13, No. 272 (E–777) Jun. 22, 1989 & JP–A–1 062020 (Fujitsu Limited) Mar. 8, 1989.

Tewksbury et al., "High $T_c$ Superconductors for Digital System Interconnections," *Solid State Electronics*, vol. 32, No. 11, Nov. 1989, Oxford, GB, pp. 947–959.

McGraw–Hill *Dictionary of Scientific and Technical Terms Third Edition*, ISBN 0–07–045269–5, definition of transmission line, copyright 1984, p. 1670.

*Primary Examiner*—Toan Tran
*Attorney, Agent, or Firm*—Staas & Halsey

[57] ABSTRACT

A signal processing device comprises superconducting wiring for providing an output signal or a transmitted signal correctly corresponding to an input signal without increasing the temperature of the device. The signal processing device has a signal input end, a signal output end, and proper signal processing circuits interposed between the signal input and output ends. The superconducting wiring connects the signal input end with the signal output end. An output end of the wiring is open, and the length of the wiring is set to be approximately 25% of the product of the pulse width and the phase velocity of the signal transmitted through the wiring.

10 Claims, 12 Drawing Sheets

Fig.11
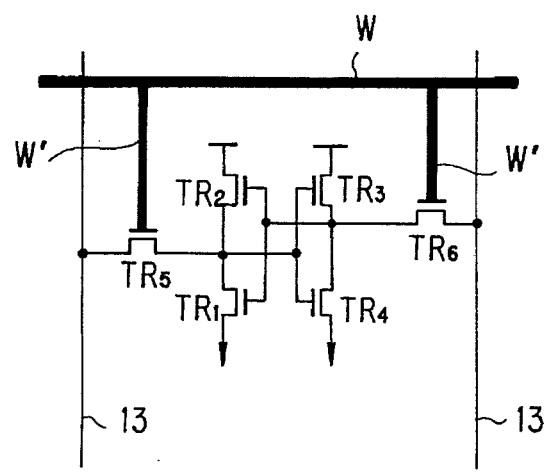
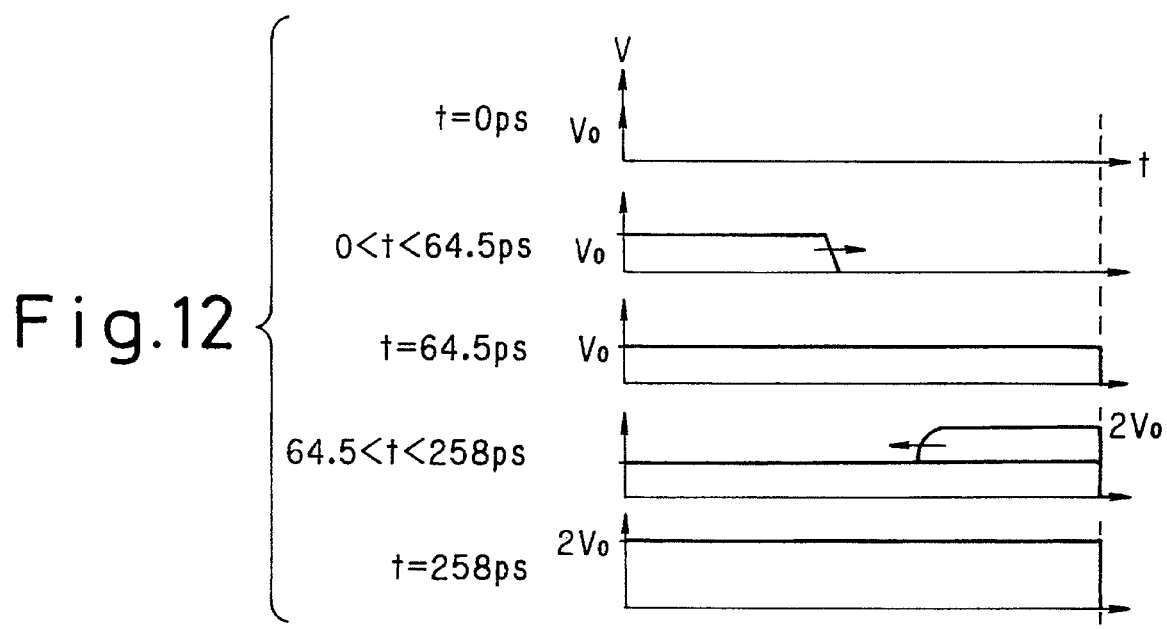
Fig.12

SIGNAL PROCESSING DEVICE AND A METHOD FOR TRANSMITTING SIGNAL

This application is a continuation, of application number 08/352,458, filed Dec. 9, 1994, now abandoned, which is a continuation of application Ser. No. 08/198,393, filed Feb. 18, 1994, now abandoned, which is a continuation of application Ser. No. 07/818,890, filed Jan. 10, 1992, now abandoned.

BACKGROUND OF THE INVENTION

1. Field of the Invention

The present invention relates to a signal processing device employed in an information processing integrated circuit, and, more particularly to a signal processing device and a signal transmitting method employed in an integrated circuit device having superconducting wiring for digital signals.

2. Description of the Related Art

In recent years, circuit integration has improved, and the need to improve the transmission velocity of a signal has increased. A hindrance to satisfying said need is the length of wiring for transmitting the signal.

A signal delay time per gate is determined by a signal delay in the wiring.

Standard metal or semiconductor wiring more or less involves electric resistance and capacitance, and a signal delay time in the wiring is mainly determined by the capacitance and resistance of the wiring.

It is possible to reduce the signal delay time by reducing the resistance in the wiring. This is the reason why recently discovered high-temperature superconducting ceramic materials that demonstrate superconductivity at a relatively high temperature, such as the temperature of liquid nitrogen, are expected to function as wiring material for integrated circuits.

When a pulse signal is provided to an input end of the superconducting wiring having no electric resistance, an output end of the wiring provides, in addition to a signal corresponding to the input signal, a continuous by-product signal, because the non-resistance wiring does not absorb energy. How to suppress such an unwanted signal, i.e., noise pulses are an important issue.

The superconducting wiring may be used to connect signal processing circuit elements with one another to fabricate a required signal processing device such as an integrated circuit, a memory circuit, and an operational circuit. When a proper pulse signal is provided to an input end of the wiring, an output end of the wiring provides an output signal involving irregular pulses. The cause of such irregular pulses has not been sufficiently analyzed yet. If the superconducting wiring provides such irregular output pulses with voltage fluctuations whenever it receives an input pulse signal, the signal processing circuit with the superconducting wiring may frequently malfunction to reduce its reliability. It is important, therefore, to prevent such irregular output pulses occurring in the signal processing device with the superconducting wiring.

To solve this problem, the inventors prepared signal processing devices with superconducting wiring and tested them to observe changes occurring in output pulse signals with respect to input pulse signals. In the tests, an input terminal of the signal processing device was connected directly to its output terminal by the superconducting wiring, and various operational elements disposed between the input and output terminals were omitted.

FIG. 1 shows a model of superconducting wiring used in the tests. An output end of the wiring is open.

Generally, the superconducting wiring demonstrates complicated electric characteristics. In standard aluminum, copper, or semiconductor wiring, inductance thereof is ignorable, so that it is only necessary to consider the resistance and capacitance thereof. In the superconducting wiring, however, resistance may be ignorable but inductance and capacitance act on each other in a complicated manner.

In the standard wiring, noise attenuates gradually. In the superconducting wiring, noise does not attenuate because there is no resistance in the wiring. The noise in the superconducting wiring may increase due to the inductance and capacitance.

In analyzing the superconducting wiring, it is difficult to uniquely determine a distribution constant of the wiring. Accordingly, the length of the wiring is divided into a plurality of unit lengths, and the inductance and capacitance of each unit length are estimated to determine an overall distribution constant. This procedure is necessary to carry out a SPICE analysis method to be explained later.

The circuit of FIG. 1 is an equivalent of a concentrated constant circuit formed by dividing the superconducting wiring into 100 sections, i.e., by dividing the overall inductance and capacitance (distribution constants) of the wiring by 100.

FIG. 2 is a schematic view showing a wiring structure devised for analyzing the superconducting wiring. In the figure, superconducting wires X form a part of a 64-megabit memory. Each wire X has a width w of 0.3 μm, a thickness t of 0.3 μm, and a space s of 0.5 μm. The thickness XOX of an $SiO_2$ film between the wire and a grounding conductor is 0.2 μm. The length a of the wire is 1 cm. According to plane parallel plate approximation, the capacitance C of the wire is 0.7 pF/cm and inductance L thereof 6.0 nH/cm.

FIG. 3 shows a waveform of an input pulse used for the analysis according to the invention. The waveform has a rise time tR of 10 ps, a fall time tF of 10 ps, a half-value width tPW of 500 ps, and a pulse height Vo of 5 V.

The pulse of FIG. 3 is applied to an input end of the superconducting wire of FIG. 2, and a pulse waveform appearing at an output end thereof is simulated and analyzed. The simulation is made according to the SPICE (Simulation Program with Integrated Circuit Emphasis), which is software developed and published by Stanford University of the U.S.

FIG. 4 shows transmission characteristics of the superconducting wire having an open output end, simulated according to the SPICE. In the figure, a continuous line represents the input waveform, and a dotted line an output waveform. When the input signal is applied to the input end of the wiring for a period of T1, the output end sequentially provides wide pulses A at regular intervals during the period T1. Even after the input signal is stopped, the output end continuously provides narrow pulses B during a period of T2.

Under these circumstances, the input signal will never be correctly transmitted through the superconducting wire. It is necessary to suppress the noise output pulses produced on the input signal.

To suppress such irregular noise pulses, a resistor RL is added to the output terminal to terminate the open end of the wiring.

FIG. 5 shows an equivalent circuit of the superconducting wiring whose output end is terminated with the resistor RL.

The impedance of the resistor RL is the same as the characteristic impedance of the wiring. Namely, the output end of the superconducting wiring of FIG. 1 is terminated with a resistor element whose impedance is identical with the characteristic impedance of the wire. Resistance of the resistor RL is expressed as follows:

$$RL = SQRT(L/C) = 92.6 \, \Omega$$

FIG. 6 shows simulated transmission characteristics of the superconducting wiring of FIG. 5, terminated with the resistor having the same impedance as the characteristic impedance. In FIG. 6, noise pulses are suppressed, and an output pulse substantially correctly reflects an input pulse, because the output end is terminated with the resistor having the same impedance as the characteristic impedance of the wiring.

In this way, when the output terminal of superconducting wiring is terminated with the characteristic impedance, a signal is transmitted through the wiring with high fidelity. In addition, the zero electric resistance of the superconducting wiring is well utilized to minimize a delay time of the wiring. In the termination resistor, however, a current flowing through the resistor is consumed to produce heat and cause power loss. This heat may increase the temperature of the circuit over a transition point of the superconducting material, and destroy the superconducting state. The wiring of FIG. 5 consumes energy of $13.4 \times 10^{-12}$ J per pulse to produce heat.

SUMMARY OF THE INVENTION

An object of the invention is to provide an integrated circuit device employing superconducting wiring that causes no temperature rise and transmits signals with high fidelity.

To achieve the above and other objects, the present invention provides a signal processing device having a signal input end, a signal output end, and proper signal processing circuits interposed between the signal input and output ends and the device is further characterized in that at least wiring for connecting the signal input end with the signal output end is made of superconducting material, an output end of the wiring is open or in high-impedance, the pulse width of an output pulse signal provided from the output end is narrower than that of an input pulse signal provided to the input end, and the pulse voltage of the output pulse signal is higher than that of the input pulse signal. In the present invention, the output end of the wiring is open or in high-impedance, and the length of the wiring is set to be approximately 25% of the product of the pulse width and the phase velocity of a signal transmitted through the wiring.

The invention also provides a signal processing device having a signal input end, a signal output end, and proper signal processing circuits interposed between the signal input and output ends, characterized in that at least wiring for connecting the signal input end with the signal output end is made of superconducting material, an output end of the wiring is open, the width of an output pulse signal provided from the output end is narrower than that of an input pulse signal provided to the input end, and the voltage of the output pulse signal is higher than that of the input pulse signal.

BRIEF DESCRIPTION OF THE DRAWINGS

FIG. 11 is a view showing the structure of a memory cell of the SRAM of FIG. 10;

FIG. 12 is a view showing changes in potential distribution in one of the word lines W of FIG. 10;

DESCRIPTION OF THE PREFERRED EMBODIMENTS

A signal processing device according to a preferred embodiment of the invention will be explained with reference to the drawings.

The inventors have made various analyses using the simulation method mentioned above to achieve the object of the invention, and found that superconducting wiring for a signal processing device has characteristics as shown in FIGS. 7A–7F.

Figure 7A:
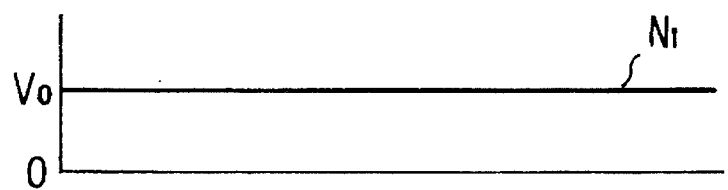
FIGS. 7A–7F are explanatory views showing principles of the invention.
Figure 7B:
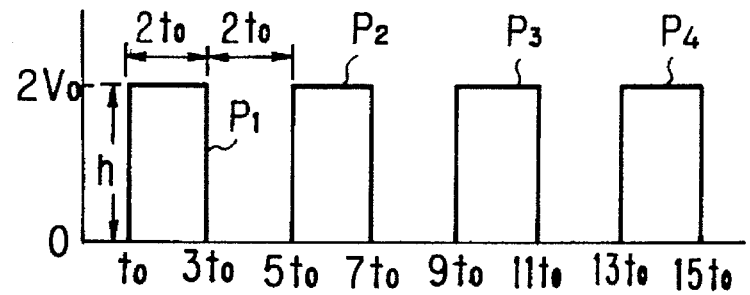

FIG. 7A shows an input signal N1 according to a step function. This signal rises at time 0. When this input signal is applied to an input end of wiring having an open output end, the output end of the wiring provides an output signal shown in FIG. 7B. A rise of a first pulse of the output signal is delayed by time t0, which is obtained by dividing the length of the wiring by a phase velocity. The output signal involves sequentially produced pulses p1, p2, p3, ..., pn. Each of these pulses has a period of 4t0, a width of 2t0, and an amplitude of h. This amplitude h is twice a step Vo (2 Vo) of the input signal.

Figure 7C:
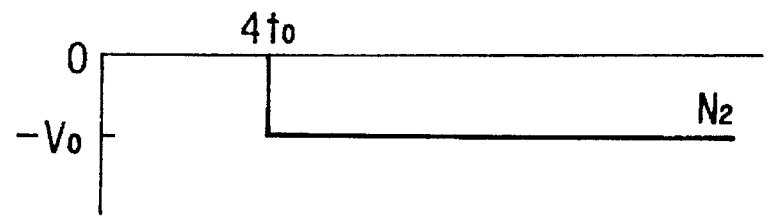
Figure 7D:
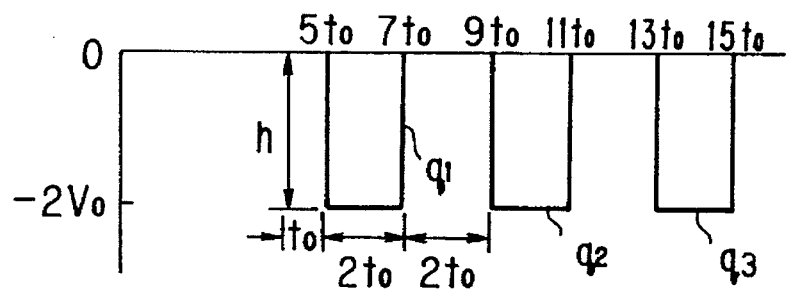

FIG. 7C shows an input signal N2 according to a step function. This signal rises at time 4t0 in opposite polarity from the input signal N1 of FIG. 7A. When the input signal N2 is applied to the wiring, the output end of the wiring provides an output signal shown in FIG. 7D. A rise of a first pulse of the output signal is delayed by t0, which is obtained by dividing the length of the wiring by a phase velocity. The output signal involves sequentially produced pulses q1, q2, ..., qn. Each of these pulses has a period of 4t0, a width of 2t0, and an amplitude of h. This amplitude h is twice the step Vo (2 Vo) of the input signal.

Figure 7E:
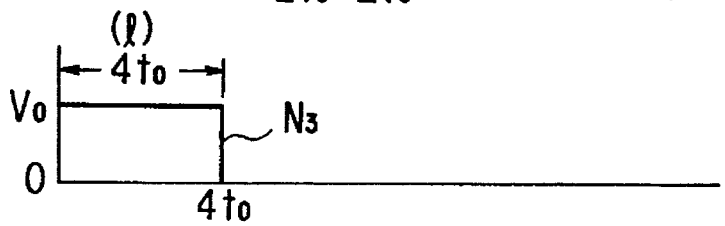
Figure 7F:
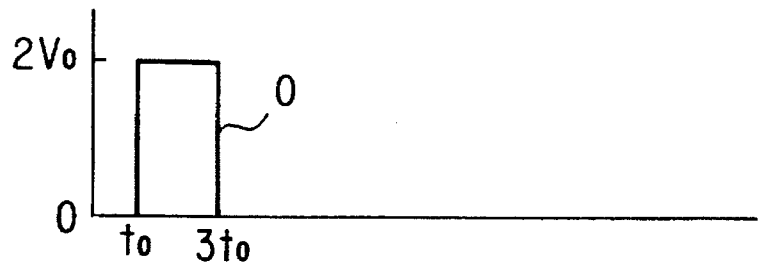

FIG. 7E shows a single pulse input signal N3 having a width of 4t0, formed by superposing the input signal N1 of FIG. 7A and the input signal N2 of FIG. 7C. FIG. 7F shows a single pulse output signal O having a width of 2t0, formed by superposing the output signal of FIG. 7B and the output signal of FIG. 7D.

As a consequence of the analyses shown in FIGS. 7A–7D, the following can be said:

When signal pulses having different polarities are sequentially applied to an input end of the wiring, i.e., when the input pulses N1 and N2 having opposite polarities are repeatedly provided to the input end of the wiring, the first input pulse N1 causes output pulses pn that may last even if the corresponding input pulse N1 disappears at the input end, and the second input pulse N2 causes output pulses qn that interfere with and cancel the output pulses pn.

Figure 8:
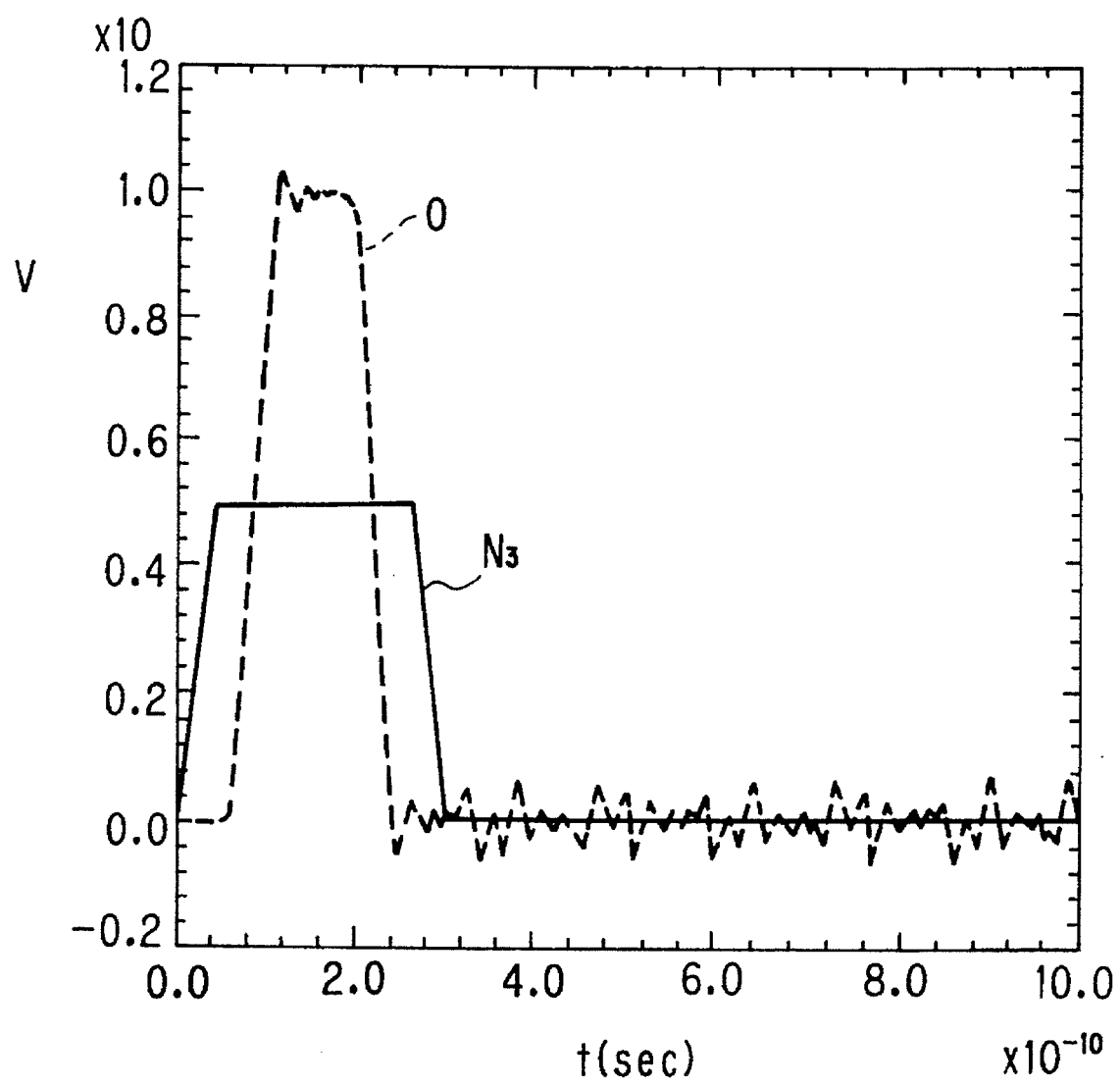
FIG. 8 is a view showing transmission characteristics of superconducting wiring of the invention according to a first analysis.

In this case, an output waveform at the output end of the wiring is not a perfect 0 V but oscillates at a small amplitude as shown in FIG. 8. During this period, it is preferred that the output voltage at the output end continuously oscillates at a suppressed amplitude so that the output pulse signal corresponding to the input pulse signal is correctly identifiable.

The width of the output pulse O corresponding to the input pulse signal N3 is narrower than that of the input pulse signal, and the voltage of the output pulse signal is higher than that of the input pulse signal.

For example, if the input pulse signal N3 provided to the input end of the superconducting wiring has an amplitude of h and a pulse width of l, the output pulse signal O corresponding to the input pulse signal N3 will have an amplitude of about 2h and a pulse width of about l/2.

Consequently, it is understood that, when the width of an input pulse provided to an input end of superconducting wiring is obtained by dividing the quadrupled distance between the input and output ends of the superconducting wiring by the phase velocity of a wave transmitted through the wiring, a one-to-one fidelity pulse wave transmission is realized through the superconducting wiring with an open end under zero power consumption.

In the above analyses, a relationship between the input pulse N3 and the rise time of the output pulse O and a relationship between the fall time of the input pulse N3 and the fall time of the output pulse O indicate that the width l of the input pulse N3 is preferably about four times the period t0 starting from the input of the input pulse signal N3 and ending at the rise of the output pulse (i.e., the phase velocity of the input pulse in the wiring).

According to the invention, the multiple is not limited to four. It may vary depending on the characteristics of a pulse signal, wiring material, various loads connected in the wiring, etc. According to the analyses made by the inventor, a practical multiple may range from 3.5 to 4.5 (reciprocals thereof being about 22.2% to 28.6%).

Based on these technical findings, a signal processing device according to the invention involves superconducting wiring having a signal input end and signal output open end. A distance between the signal input and output ends, i.e., an approximate length of the wiring is preferably derived by multiplying the width of a signal pulse transmitted through the wiring by a phase velocity at which the signal is transmitted through the wiring and dividing the product thus obtained by four, i.e., about 25% of the product. According to the invention, this value may range from about 20% to about 30%.

Figure 2:
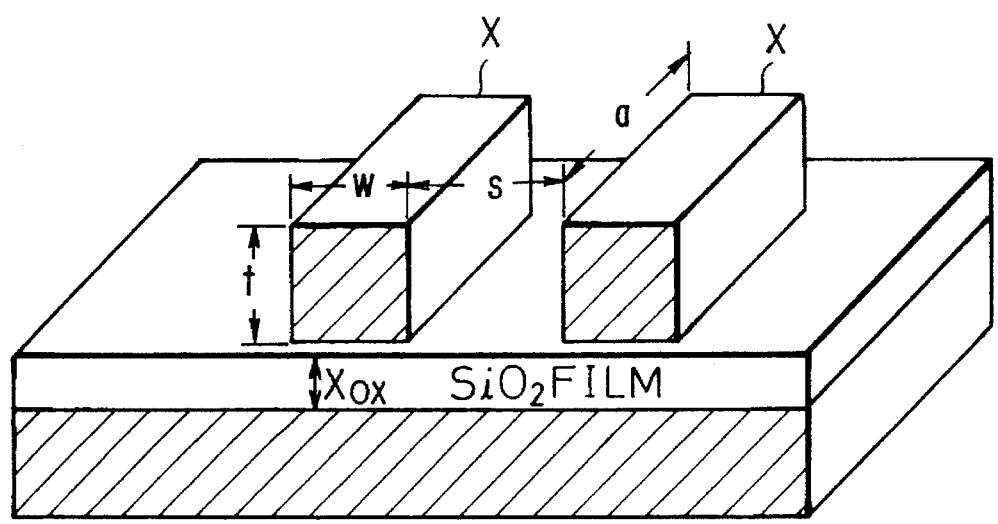
FIG. 2 is a view showing a wiring structure and circuit constants thereof, prepared for analysis purpose.

In the wiring structure shown in FIG. 2, the phase velocity is $1/\text{SQRT}(LC)=1.55 \times 10^{10}$ cm/s, and a time for transmitting an input signal from the input end to the output end of the wiring is 64.5 ps with the wiring length being 1 cm. Accordingly, the quadrupled time is 258 ps.

Figure 1:
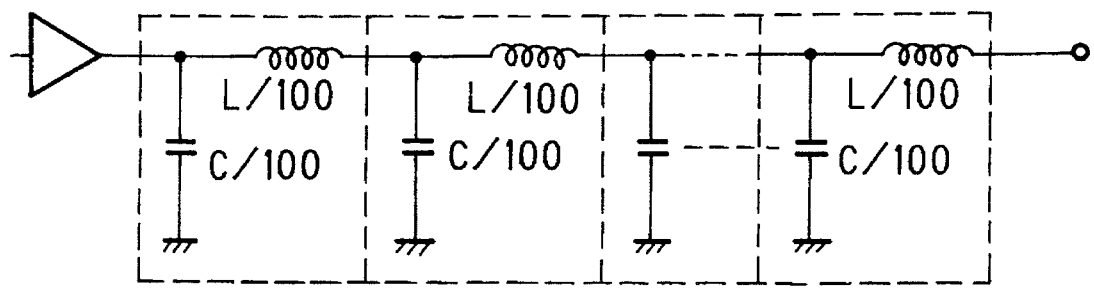
FIG. 1 is a view showing an equivalent circuit of superconducting wiring with an open output end.
Figure 3:
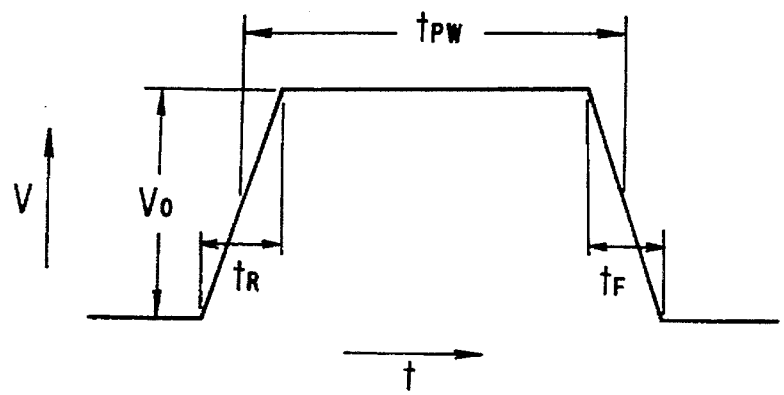
FIG. 3 is a view showing a waveform of an input pulse used for the analysis.
Figure 4:
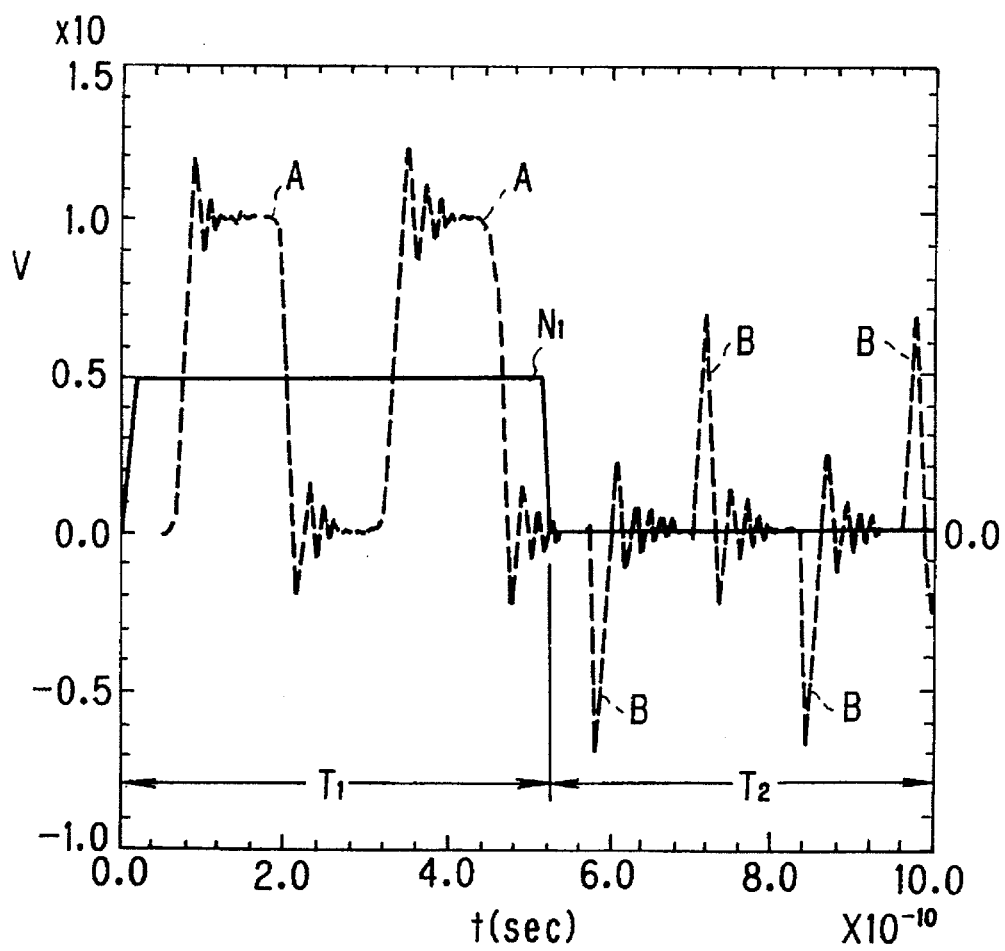
FIG. 4 is a view showing transmission characteristics of superconducting wiring with an open output end.
Figure 5:
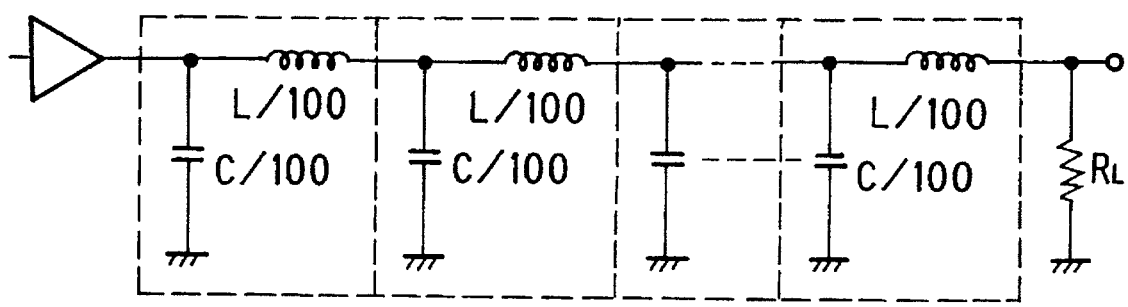
FIG. 5 is a view showing an equivalent circuit of superconducting wiring with an output end terminated with a resistor having the same impedance as the characteristic impedance of the wiring.
Figure 6:
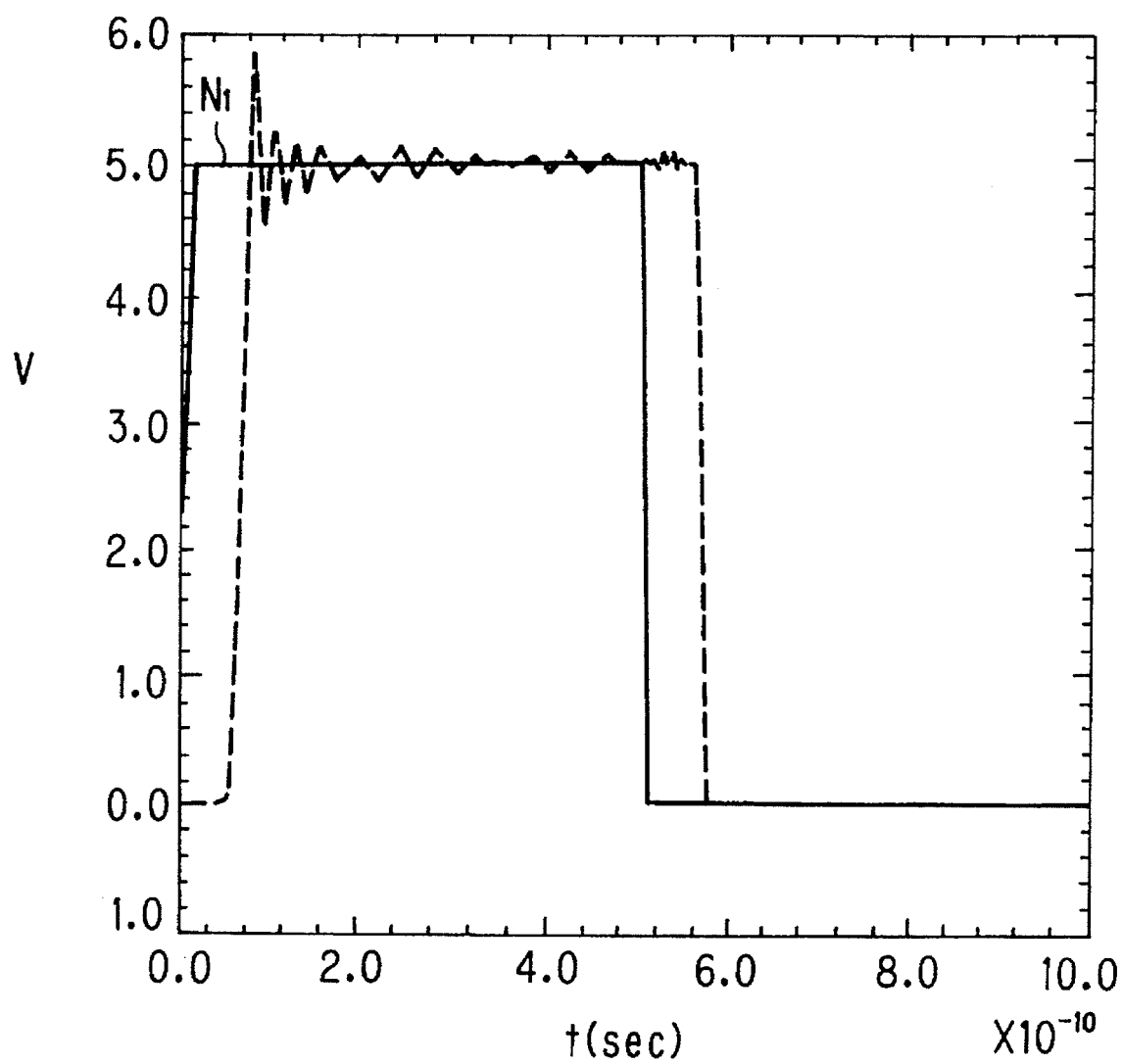
FIG. 6 is a view showing transmission characteristics of the superconducting wiring of FIG. 5.

Analyses are made by applying the input pulse waveform of FIG. 3 to the superconducting wiring of FIG. 1. As shown in FIG. 1, the superconducting wiring has an open output end and an input end to which the input pulse of FIG. 3 is applied. The input pulse has a half-value width tPW of 258 ps, a rise time tR of 40 ps, and a fall time tF of 40 ps.

Figure 9:
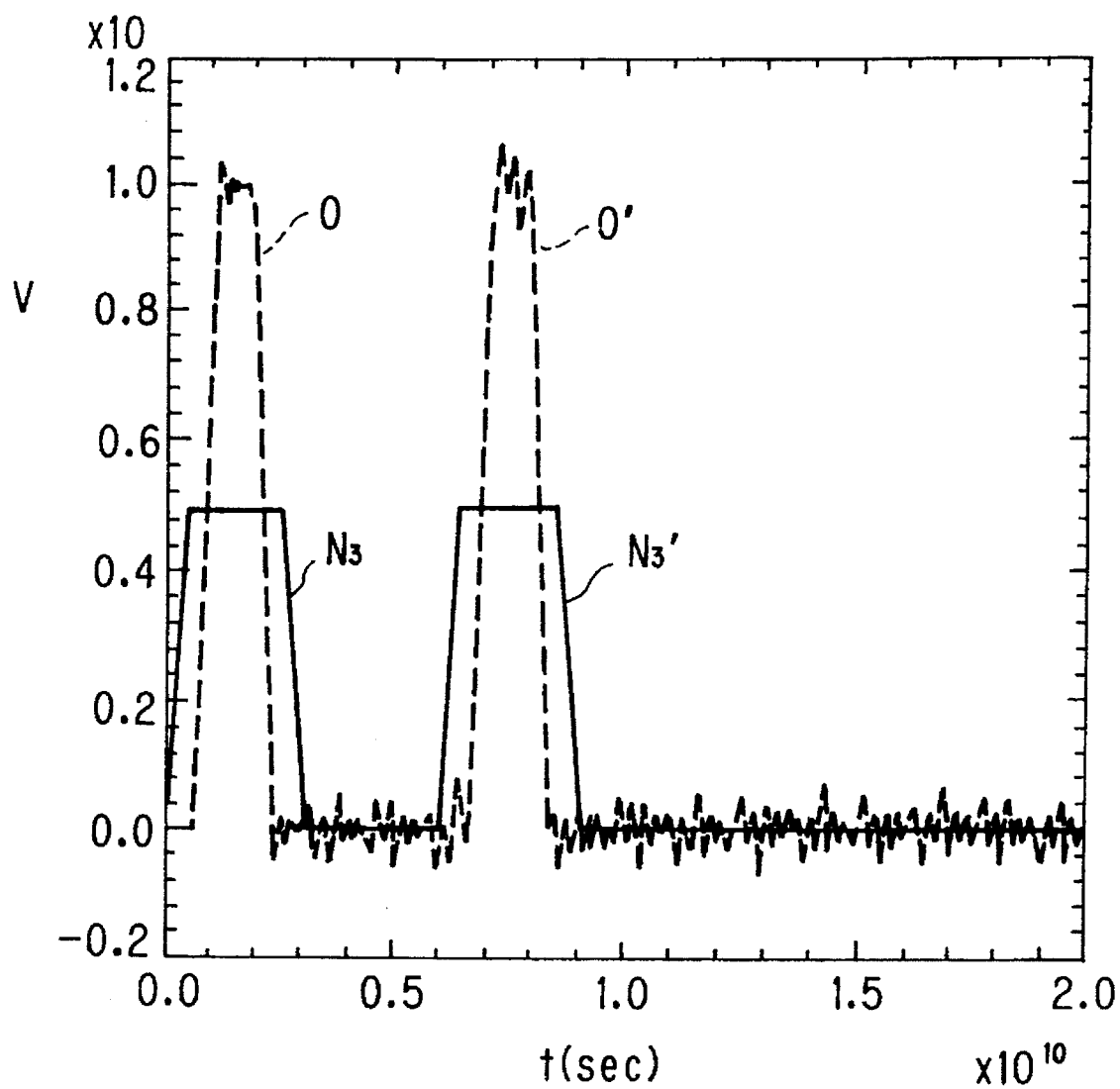
FIG. 9 is a view showing transmission characteristics of the superconducting wiring of the invention according to a second analysis.

FIG. 8 shows transmission characteristics of the superconducting wiring according to a first analysis of the invention. In the figure, one input pulse is provided to the input end of the wiring, and one output pulse is provided from the output end of the wiring. Although the output end is not terminated with the characteristic impedance, noise pulses caused by the input signal are suppressed to realize a high-fidelity one-to-one pulse transmission. In this analysis, the height of the pulse is 4.5 V. FIG. 9 shows transmission characteristics of the superconducting wiring according to a second analysis of the invention. In the figure, two input pulses are sequentially provided to the input end of the wiring, and two output pulses are provided from the output end of the wiring. Namely, similar to the case of FIG. 8, the invention of FIG. 9 achieves a high-fidelity one-to-one pulse transmission.

This invention is also effective for three or more input pulses.

Superconducting materials to be used for forming the wiring according to the invention are not particularly limited. The employable superconducting materials are, for example, YBCO composed of yttrium, barium, copper, and oxygen, demonstrating superconductivity at a temperature of 88K, and BSCCO composed of bismuth, strontium, calcium, copper, and oxygen, demonstrating superconductivity at a temperature of 120K. Any one of these proper superconducting materials is deposited on, for example, a semiconductor substrate according to a proper method, and formed into wiring having optional width and length. A surface layer of the deposited material is selectively heated and annealed with a lamp or laser into a required shape.

The signal processing device according to the invention is applicable for any kind of circuit having an input end to which a proper signal is applied, an output end for providing a predetermined output signal in response to the input signal, and wiring having a predetermined shape extending between the input and output ends, to provide a signal processing function. The wiring may directly connect the input end with the output end. Alternatively, operational elements and circuits such as transistors, buffers, resistors, capacitors, amplifiers, memories, and comparators may be optionally disposed in the wiring.

The signal processing device according to the invention may be a semiconductor integrated circuit having clock lines formed of the superconducting wiring of the invention. In this case, the pulse width (an ON period) of an input clock pulse is set according to the above-mentioned conditions.

Figure 10:
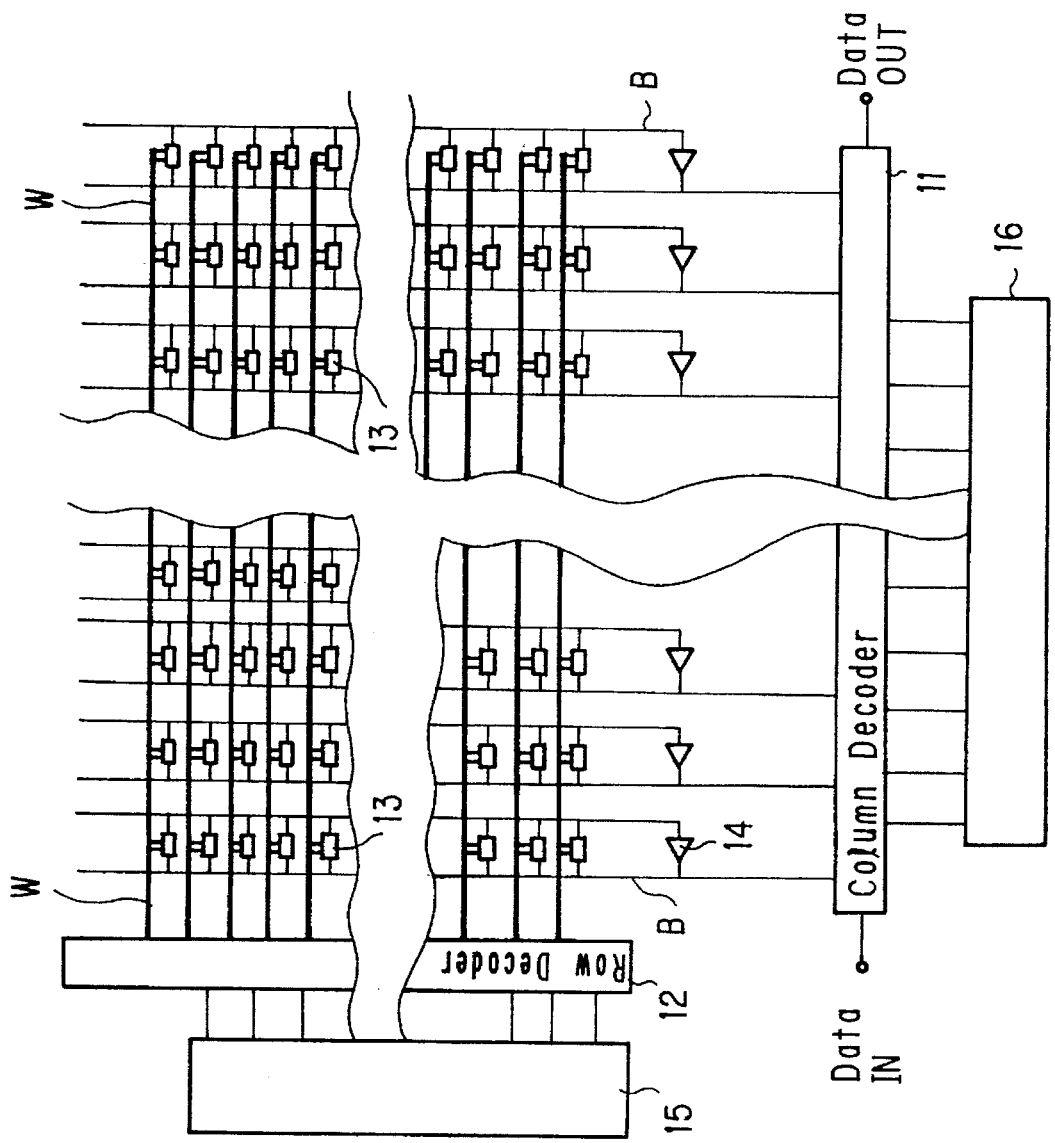
FIG. 10 is a view showing an SRAM employing a signal processing device according to the invention.
Figure 13A:
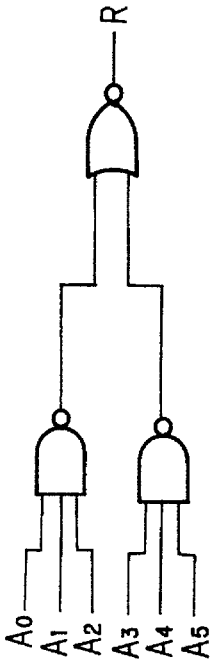
FIGS. 13a–13D are views showing examples of row decoders employable in the SRAM of FIG. 10.
Figure 13B:
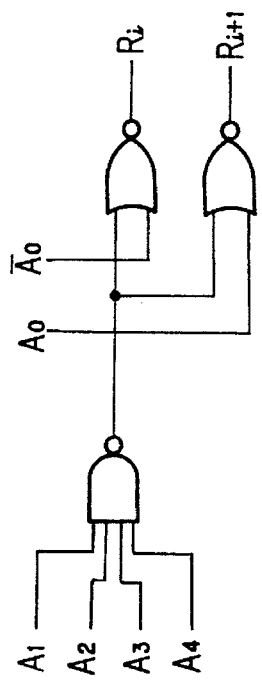
Figure 13D:
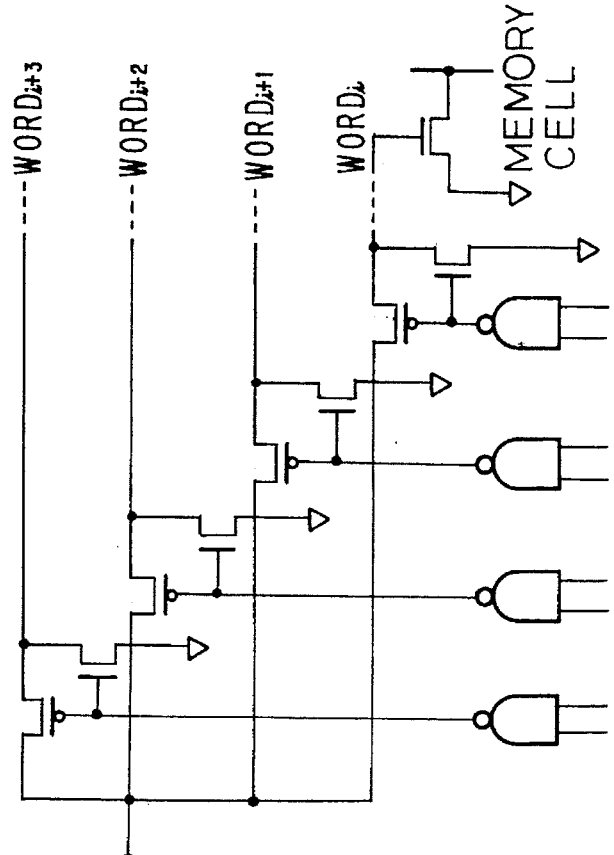
Figure 13C:
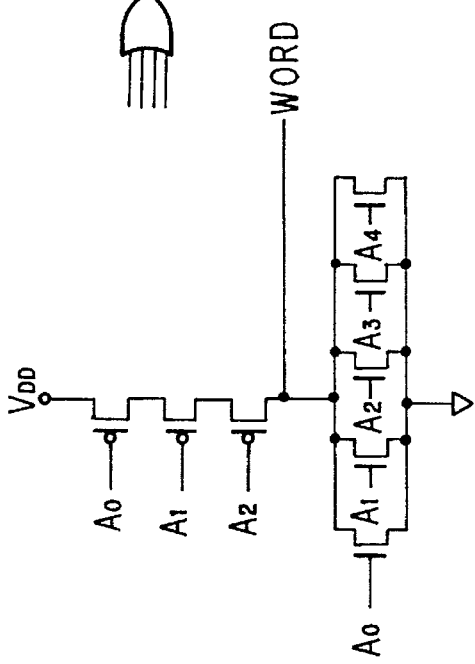

The signal processing device of the invention is applicable for a memory circuit shown in FIGS. 10 and 11. In these figures, wires indicated with thick lines are formed of the superconducting wiring having an open end according to the invention.

In FIG. 10, the memory circuit, i.e., a 64-megabit SRAM, has 8192 word lines W and 8192 bit lines B that are arranged in a matrix. A memory cell 13 is disposed at each intersection of the word and bit lines. A row address unit 15 for selecting the word lines W controls a row decoder 12. A column address unit 16 for selecting the bit lines B controls a column decoder 11. Each pair of the bit lines B is controlled and selected by a refresh amplifier 14 formed of a differential sense amplifier, etc.

FIG. 11 shows an example of a structure of the memory cell 13. The memory cell 13 comprises four data storing MOSFETs TR1 to TR4 and switching MOSFETs TR5 and TR6.

In FIGS. 10 and 11, the word lines W and leads W', which are branched from the word lines W and connected to the respective memory cells 13, are formed of the superconducting wiring having a predetermined width.

Detailed specifications of the SRAM shown in FIGS. 10 and 11 are as follows:

Wiring width: 0.3 μm

Wiring interval: 0.5 μm

The length of each word line: 1 cm

Bit line pitch: 1.22 μm/cell

A rise time of a pulse to be transmitted from one end to the other in the word line: 64.5 ps The width of the word line driving pulse: 258 ps If the capacitance C of the wiring is 0.7 pF/cm and the inductance L thereof is 6.0 nH/cm, the transmission speed Wo of the pulse is Wo=1/SQRT(LC)=$1.55 \times 10^{10}$ cm/sec. Then, the transmission velocity t0 of the pulse for the length of the wiring is "the length of the wiring" divided by "the phase velocity"=1 cm/$1.55 \times 10^{10}$ cm/sec=64.5 ps.

FIG. 12 shows the potential of the word line W of the SRAM. A driver of any one of the word lines W provides, from the left end of the figure, a pulse having a voltage of Vo to the superconducting wiring. Thereafter, an output pulse having a voltage of Vo is successively moved toward the right-hand side. During a period of 193.5 ps between 64.5 ps and 258 ps, the output pulse having the output voltage Vo is successively moved toward the left-hand side, and the selected word line W will have a high level of 2Vo. During this period, the refresh amplifiers 14 are activated to refresh the memory cells 13, and an output voltage of the refresh amplifiers 14 is latched.

Figure 14:
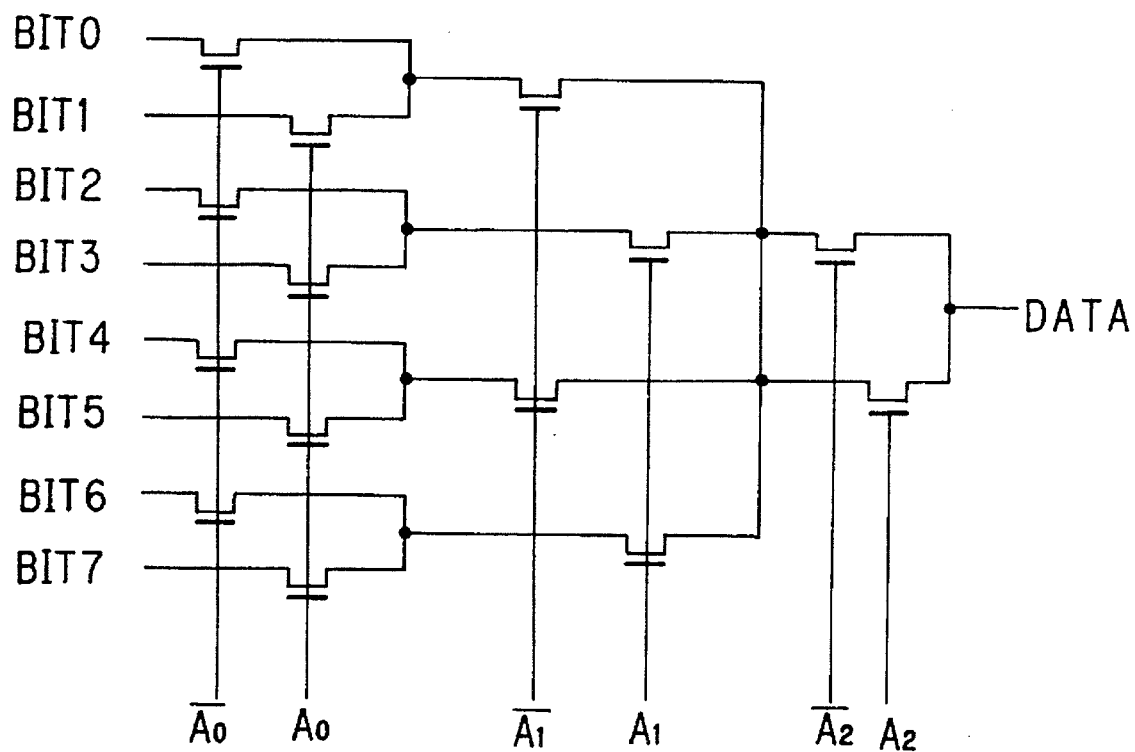
FIG. 14 is a view showing an example of a column decoder employable in the SRAM of FIG. 10.
Figure 15B:
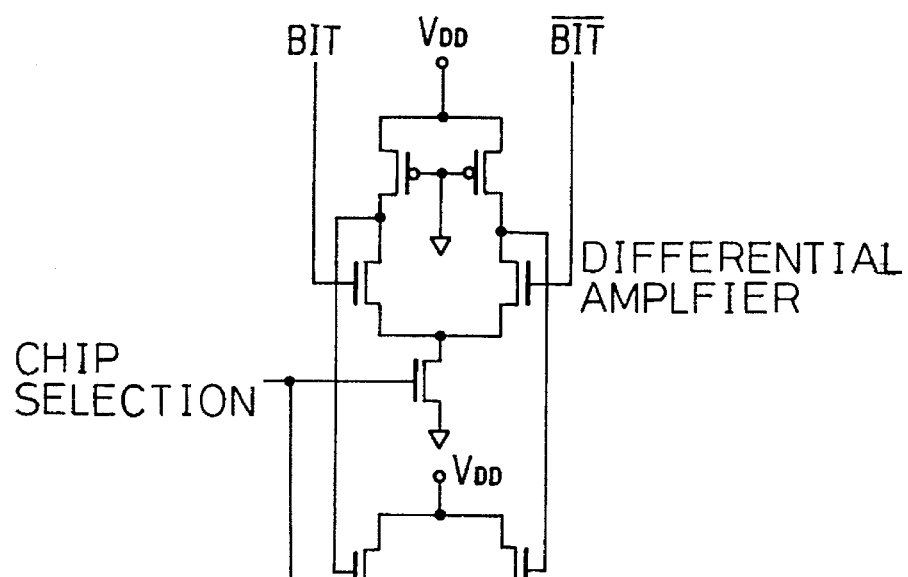
FIGS. 15A–15B are views showing examples of a refresh amplifier employable in the SRAM of FIG. 10.
Figure 15A:
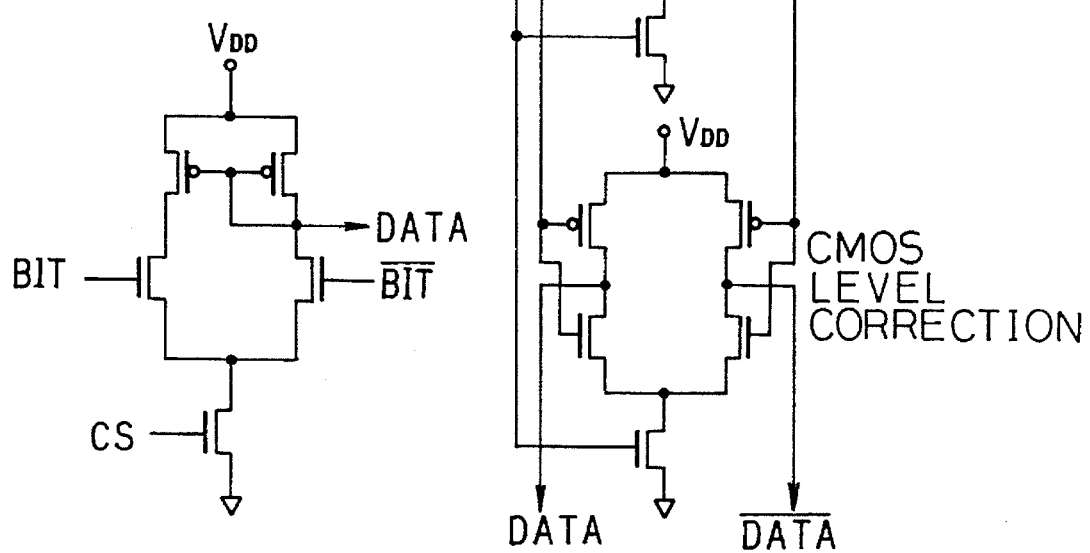

The row decoder 12 of the SRAM of FIG. 10 may be any one of decoder circuits shown in FIG. 13A–13D. The column decoder 11 may be a column decoder shown in FIG. 14. The refresh amplifier 14 may be a differential sense amplifier shown in FIGS. 15A–15B.

The frequency of a signal handled by the signal processing device of the invention is preferably in the order of megahertz.

As explained above, the invention provides an integrated circuit having superconducting wiring that causes no temperature increase and transmits pulse signals with high fidelity. The invention, therefore, greatly contributes to digital signal processing operational devices and control devices.

Unlike conventional signal processing devices, the signal processing device of the invention provides, with respect to an input pulse signal provided to an input end of the wiring, an output pulse signal whose pulse width is narrower than that of the input pulse signal and whose pulse voltage is higher than that of the input pulse signal.

We claim:

1. A superconductive transmission line capable of transmitting a pulse from an input end to an output end comprising:

an output end which is open or in high-impedance; and said superconductive transmission line has a length approximately 20% to 30% of a product of a pulse width of the pulse and a phase velocity of said superconductive transmission line.

2. A superconductive transmission line according to claim 1, wherein said superconductive transmission line has a length approximately 25% of the product of the pulse width of the pulse and the phase velocity of said superconductive transmission line.

3. A superconductive transmission line according to claim 1, wherein said superconductive transmission line causes, although no input pulse signal is provided to the input end, an output voltage at the output end continuously oscillating at a regulated amplitude so that an output pulse at the output end is sufficiently identifiable.

4. A superconductive transmission line capable of transmitting a pulse from an input end to an output end, comprising:

an output end which is an open end; and said superconductive transmission line has a length approximately one-fourth of a product of a pulse width of the pulse and a phase velocity of said superconductive transmission line.

5. A superconductive transmission line according to claim 2, wherein said superconductive transmission line causes, although no input pulse signal is provided to the input end, an output voltage at the output end continuously oscillating at a regulated amplitude so that an output pulse at the output end is sufficiently identifiable.

6. A superconductive transmission line according to claim 1, wherein said superconductive transmission line causes an output pulse at the output end to be narrower in time and higher in amplitude than the pulse transmitted from the input end.

7. A superconductive transmission line according to claim 1, wherein said superconductive transmission line is a superconductive wiring between devices on an integrated circuit substrate.

8. A method of generating a pulse capable of transmission from an input end to a high-impedance output end of a superconductive transmission line, said method comprising the steps of:

(a) generating a pulse having a width equal to a value obtained by dividing a length of the superconductive transmission line by approximately 20% to 30% of a phase velocity of the superconductive transmission line; and (b) providing the pulse to the input end of the superconductive transmission line.

9. A method according to claim 8, wherein said step (a) comprises the substep of (a1) generating a pulse having a width equal to a value obtained by dividing a length of the superconductive transmission line by about 22.2% to 28.6% of a phase velocity of the superconductive transmission line.

10. A method according to claim 9, wherein said substep (a1) comprises the substep of (a1I) generating a pulse having a width approximately equal to a value obtained by dividing a length of the superconductive transmission line by 25% of a phase velocity of the superconductive transmission line.

* * * * *

UNITED STATES PATENT AND TRADEMARK OFFICE
CERTIFICATE OF CORRECTION

PATENT NO. : 5,619,159
DATED : Apr. 8, 1997
INVENTOR(S) : SASAKI et al.

It is certified that error appears in the above-indentified patent and that said Letters Patent is hereby corrected as shown below:

Col. 1,   line 14, after "circuit" delete ",";
        line 15, after "particularly" insert --,--;
        line 44, after "pulses", insert --,--.

Col. 4,   line 29, change "13a-13D" to --13A-13D--.

Col. 5,   lines 31, change "1" to --$\ell$--;
        lines 33, change "1/2" to --$\ell/2$--;
        line 43, change "Lime" to --time--;
        lines 45, change "1" to --$\ell$--;
        line 54, delete "10".

Col. 6,   line 20, begin a new paragraph with "FIG. 9".

Col. 7,   line 48, change "FIG." to "FIGS.".

Signed and Sealed this

Twelfth Day of August, 1997

Attest:

BRUCE LEHMAN

Attesting Officer          Commissioner of Patents and Trademarks